United States Patent [19]

Ho et al.

[11] 4,316,209

[45] Feb. 16, 1982

[54] METAL/SILICON CONTACT AND METHODS OF FABRICATION THEREOF

[75] Inventors: Paul S. Ho, Chappaqua, N.Y.; Uwe Köster, Bochum, Fed. Rep. of Germany; Tung-Sheng Kuan, Shrub Oak, N.Y.; Iwao Ohdomari, Yokohama, Japan; Arnold Reisman, Yorktown Heights, N.Y.

[73] Assignee: International Business Machines Corporation, Armonk, N.Y.

[21] Appl. No.: 71,528

[22] Filed: Aug. 31, 1979

[51] Int. Cl.³ ............... H01L 23/48; H01L 29/46; H01L 29/62

[52] U.S. Cl. ............... 357/67; 357/15; 357/71; 357/65

[58] Field of Search ............... 357/15, 67, 71, 65

[56] References Cited

U.S. PATENT DOCUMENTS

| | | | |
|---|---|---|---|
| 3,200,312 | 8/1965 | Carman | 357/71 |
| 3,657,617 | 4/1972 | Morgan | 357/67 |
| 3,830,657 | 8/1974 | Farrar | 357/67 |
| 3,968,272 | 7/1976 | Anand | 357/67 |
| 4,077,045 | 2/1978 | Greeson et al. | 357/67 |
| 4,151,545 | 4/1979 | Schnepf et al. | 357/67 |
| 4,174,521 | 11/1979 | Neale | 357/67 |
| 4,179,534 | 12/1979 | Chang et al. | 357/67 |
| 4,224,115 | 9/1980 | Nara et al. | 357/67 |
| 4,256,513 | 3/1981 | Voshida et al. | 357/67 |

FOREIGN PATENT DOCUMENTS

| | | | |
|---|---|---|---|
| 791343 | 7/1968 | Canada | 357/67 |
| 52-29183 | 3/1977 | Japan | 357/67 |

Primary Examiner—Andrew J. James
Attorney, Agent, or Firm—Michael J. Weins; Hansel L. McGee

[57] ABSTRACT

Methods and resulting structures for thermally stable metal/silicon contacts are described. The resulting contacts are aluminum which is alloyed with at least one noble metal from the group of Pd and Pt wherein at least one region of the contact is further alloyed with silicon.

5 Claims, 6 Drawing Figures

METAL/SILICON CONTACT AND METHODS OF FABRICATION THEREOF

TECHNICAL FIELD

The present invention relates in general to metal/silicon ohmic contacts and Schottky barrier contacts, and particularly to an improved aluminum silicon ohmic or Schottky barrier contact with enhanced thermal stability.

BACKGROUND ART

It has been appreciated that an aluminum-silicon interaction occurs when aluminum is in direct contact with silicon at elevated temperatures. W. Chu et al in IBM Technical Disclosure Bulletin, Volume 19, No. 7, p. 2532 (December 1976), suggest employing a transition metal oxide as an intermediate layer between the aluminum contact and the silicon to overcome this problem. While the Chu et al technique eliminates interaction of aluminum with silicon, a high resistance contact may result due to the existence of the interface between the transition metal oxide and the silicon.

An alternative solution to the use of transition metal oxides as a reaction barrier has been to interpose silicides and/or metallic layers between the underlying silicon and the conductor metallurgy.

When a silicide is interposed between an aluminum conductor and a silicon substrate, then, depending on the impurity concentration in the silicon either an ohmic or Schottky barrier contact as well as a reaction barrier is formed between the aluminum and the silicon. However, the aluminum conductor may react with the silicide during subsequent elevated temperature processing steps such as annealing, and result in penetration of the aluminum through the silicide. This can result in alteration of the electrical characteristic of the original silicide-silicon contact, e.g. in a Schottky barrier and it may result in electrically shorting the height of the underlying junction. This problem has been addressed by Hollins in U.S. Pat. No. 3,906,540 and is solved by using an intermediate layer of a refractory metal, such as Mo, Ti, W, Ta, or alloys thereof, to block the interaction of the aluminum with the silicide. The use of Cr as the intermediate layer between an aluminum contact and a silicide was pointed out by T. M. Reith and M. Revitz in IBM Technical Disclosure Bulletin, Vol. 16, No. 11, page 3586 (April 1974). Since the silicide is usually formed by depositing a metal onto the silicon substrate, and thereafter heating to react and form a silicide, the problem of a high resistance interface does not exist between the silicide and the silicon substrate. Instead a highly resistive interface can exist between the refractory metal and the silicide because of the nature of such an interface, and also, because of possible contamination of the silicide refractory metal interface. In addition, generation of this hierarchy of metallic film composites can lead to unwanted stress phenomena, embrittlement, or delamination which impairs the reliability of the contact.

P. S. Ho et al in the IBM Technical Disclosure Bulletin, Vol. 21, No. 8, page 3372, January 1979, have extended the principle of using an intermediate layer between an aluminum contact and the silicide layer. Their technique substitutes either aluminum-palladium or aluminum-platinum alloys for the refractory metals. These alloys serve a function similar to that served by the refractory metal by providing a barrier to prevent the interaction of the aluminum with the silicide.

The methods of Ho et al, Reith et al, and Hollins, all require a silicide to be formed on a silicon substrate before their method can be practiced. As has been mentioned earlier, the silicide is usually formed by depositing a metal onto the silicon substrate and thereafter heating to react with the silicon substrate to form a silicide. Thus, in general, the formation of the silicide, such as PtSi and $Pd_2Si$, results in consumption of an amount of silicon from the substrate about equal to the amount of metal deposited thereon. In the case of shallow junctions which are to be contacted such as those in small insulated gate field effect transistors (FET's), the consumption of silicon in forming a useable contact can result in depletion of a significant portion, of the active region of the device making the design of a practical process which takes into account process tolerances very difficult. When extremely shallow junctions are to be contacted there may be no practical process.

Alternatively, Rosvold in U.S. Pat. No. 3,938,243 teaches the co-deposition of Pt and Ni onto a silicon substrate and thereafter reacting to form a ternary alloy with silicon. The resulting ternary alloys which he describes are mixtures of about equal amounts of Pt-Ni and silicon. These alloys will interact with an aluminum conductor in a fashion similar to the reaction of other silicides unless methods such as those of Ho et al, Reith et al, or Hollins are employed to prevent such interaction. Furthermore, formation of such ternary silicides consume silicon in an amount similar to what occurs during the formation of PtSi for $Pd_2Si$ making these ternary alloys marginally useful for shallow junctions.

Crowder et al in a copending application, Ser. No. 811,914 assigned to the assignee of the present application, discloses a method for codepositing a silicide onto a silicon substrate by co-evaporation of silicon and a silicide forming metal. While this technique eliminates the problems of the consumption of silicon from the substrate it does not offer an opportunity for reaction of the deposited silicide with the substrate. Since the deposited layer does not react with the substrate, a high resistance interface is probably created between the substrate and the deposited material, thereby limiting its effectiveness as a contact Furthermore, this technique does not address the problem of the Al-silicide penetration phenomenon, and further processing steps, such as those suggested by Ho et al, and Hollins, will be required to overcome this problem.

The use of an intermetallic compound as a reaction barrier has been proposed by Magdo in U.S. Pat. No. 3,995,301 assigned to the present assignee. This patent teaches depositing aluminum onto a silicide layer, thereafter heat treating in a temperature range of 400° or 450° to transform the silicide to form an aluminum-platinum compound of the form of $Al_2Pt$. This technique provides a new contact of $Al_2Pt$ to the silicon substrate which lowers the barrier height from about 0.8 eV of PtSi to about 0.72 eV. The Magdo patent requires the deposition of a silicide forming metal onto the silicon substrate and reacting thereafter to form a silicide. Since a silicide layer must be formed during processing this technique will be subject to the same limitations as earlier set forth with respect to the formation of a silicide barrier contact on shallow junction devices. Using a similar approach, and Howard et al in U.S. Pat. No. 4,140,020 discloses and claims the formation of binary intermetallic compounds on the surfaces of silicon substrates used for contacts and Schottky barriers. In this latter technique, metals forming binary intermetallic compounds are codeposited and subsequently reacted by heat treating. Again, this technique suffers from the same shortcoming as does the method of Crowder et al in that there will be no reaction between the silicon substrate and the layers deposited thereon which is necessary to avoid formation of a high resistance interface.

DISCLOSURE OF INVENTION

It is an object of this invention to provide an insitu formed ohmic metal contact for heavily doped silicon substrates.

A second object of this invention is to provide an insitu formed Schottky barrier between a metal contact and a silicon substrate.

A third object of this invention is to provide a method for fabrication of thermally stable ohmic contacts which contain a ternary compound.

A further object of this invention is to provide a method for forming a contact which reacts with the silicon substrate on heat treatment, but in which the reaction with the substrate consumes only small quantities of the silicon thereby allowing fabrication of thermally stable shallow junctions.

Still another object of this invention is to provide a junction which is thermally stable to temperatures as high as approximately 500° C. in the presence of an overlying aluminum film.

These and other objects of this invention will become more apparent from the study of the device herein described and the method for fabrication of the same.

The contact comprises aluminum alloyed with a noble metal from the group of Pd or Pt. At least a region of the contact adjacent to the substrate is further alloyed with Silicon.

The contact is fabricated by co-depositing an alloy of aluminum and at least one noble metal from the group of Pt and Pd onto a silicon substrate. The aluminum content of the co-deposited layer is between about 40 to 60 atomic %. The co-deposited alloy is heated to between about 400° C. to 600° C. for a time sufficient to develop a region at the substrate interface which is further alloyed with silicon.

BEST MODE OF CARRYING OUT THE INVENTION

Figure 1:
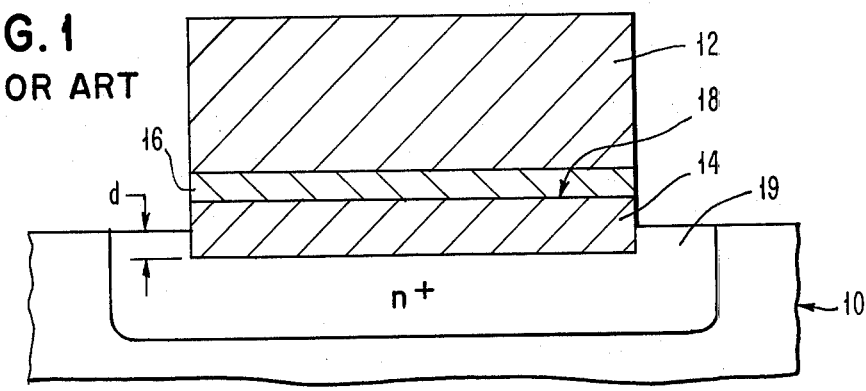
FIG. 1 is an illustration of a prior art Schottky barrier contact with an associated aluminum connector.

FIG. 1 is a representation of a prior art metal/silicon ohmic contact deposited on a p-n silicon junction. The silicon substrate 10 is joined to an aluminum conductor 12 through a series of intermediate metallurgies. Typically, a platinum or palladium silicide layer 14 will be in contact with the silicon substrate 10 to form the ohmic contact to the junction. Then, interposed between the silicide layer 14 and the connector 12 will be a barrier layer 16. This barrier layer may be a refractory metal, such as chromium or alternatively an aluminum palladium or aluminum platinum compound. The resulting contact frequently is susceptible to excessive resistance due to the nature of the interface between the silicide layer 14 and the barrier layer 16, and possible contaminations at the surface 18 which forms the interface. Another problem with the prior art contacting procedure is that the formation of the silicide layer 14 consumes silicon from the substrate 10. For $Pd_2Si$ and PtSi, the Si consumption, as measured by the depth of silicide penetration d, will be about equal to the thickness of the metal layer which was deposited on the substrate 10 and thereafter reacted with it to form a silicide. In the case of devices with a shallow n+ active region 19 such as insulated gate field effect transistors, IGFET's, it is possible for the consumption of the n+ active region 19 by the silicide layer 14 to destroy the characteristics of the resulting device during formation of the contact. An even more serious problem is that during annealing treatments following conductor metallization and patterning the conductor metal may penetrate throuugh the silicide and through the junction destroying the latter if an additional barrier layer is not present. In IGFET fabrication such additional barrier layers are not normally employed and therefore the junctions are particularly subject to penetration of the conductor metal.

Figure 2:
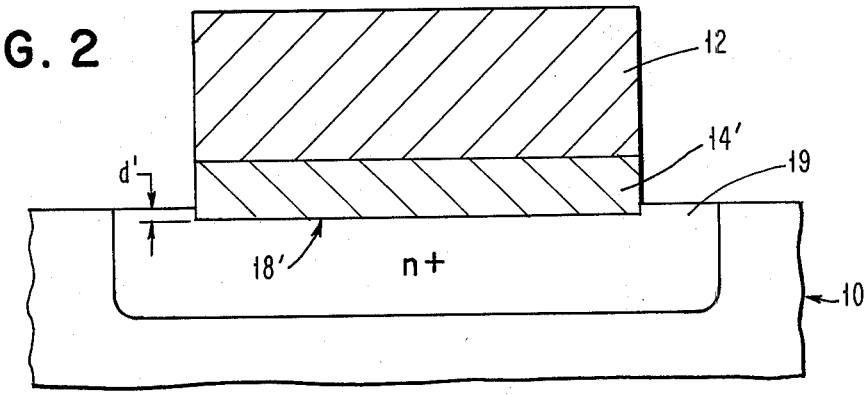
FIG. 2 is an illustration of one embodiment of the contact of the present invention with an associated aluminum conductor.

FIG. 2 is a pictorial representation of one embodiment of the present invention. A silicon substrate 10 is attached to an aluminum conductor 12 through an intermediate layer 14' which is an alloy of aluminum and one of the noble metals, either Pd or Pt. At least a region of the layer 14' is further alloyed with silicon to form an aluminum noble metal silicon alloy. When Pd is employed the preferred alloy is $Al_3Pd_4Si$, and when the noble metal employed is platinum the preferred ternary alloy is $Al_3Pt_4Si$. In contrast to the formation of the prior art binary alloy $Pd_2Si$ or PtSi, the ternary alloy, $Al_3Pd_4Si$ or $Al_3Pt_4Si$, consumes only about 1/7 of the amount of silicon. This results in reduced penetration depths d' for equivalent metal deposits and this leaves the n+ active region 19 substantially intact, avoiding degradation of the characteristics of the resulting device. The ternary alloy region is generated at the interface 18' between the silicon substrate 10 and the noble metal aluminum alloy region 14. It is preferable that as much of the region 14 be alloyed with silicon as is practical thereby forming an aluminum noble metal silicon compound throughout the region 14.

In fabricating a device such as represented in FIG. 1 or FIG 2, a silicon substrate of the n type silicon having a doping level of about $10^{16}$ atoms per cc can be utilized to form a Schottky barrier junction, otherwise a more heavily doped n or p type substrate can be used to form an ohmic contact. The selection of appropriate doping levels to form an ohmic contact or a Schottky barrier contact is well recognized in the art.

Figure 3:
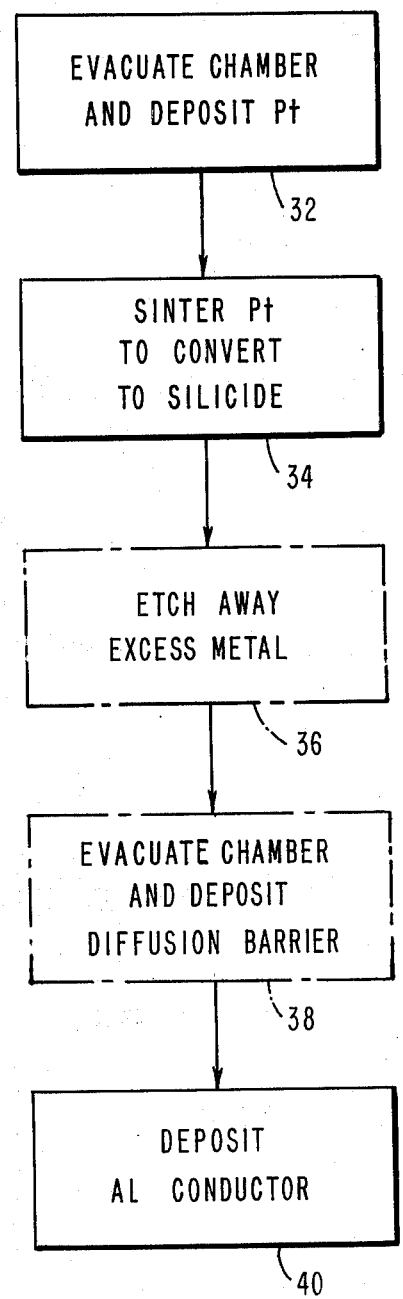
FIG. 3 is a flow diagram illustrating fabrication steps for the production of the prior art device of FIG. 1.

FIG. 3 is a flow diagram which characterizes the steps typically undertaken to produce the prior art structure such as shown in FIG. 1. After cleaning, the silicon substrate 10 is placed in a chamber and the pressure is reduced to approximately $10^{-7}$ torr, and thereafter Pt or Pd is deposited onto the silicon substrate 10 as is indicated in step 32. The deposit thickness is typically about 500 Å.

After deposition, the substrate 10 is sintered in vacuum for about 20 minutes. In the case of a palladium deposit the temperature for sintering is approximately 250° C., while for a platinum deposit the temperature is about 600° C. The sintering treatment is illustrated in step 34 and converts the deposited metal to a silicide layer 14 shown in FIG. 1.

Optionally, to assure the removal of any residual platinum or palladium metal, the substrate 10 with the attached silicide layer 14 may be removed from vacuum and etched to remove any residual unreacted metal. Palladium may be removed by employing potassium iodide as an etchant, while platinum may be removed with aqua regia. This optional step is shown in the FIG. 3 by step 36 which is shown with a broken line to indicate that it is optional.

Subsequent to the sintering step 34 an optional second deposition step 38 may be employed where a metal layer, such as Cr or Al and either Pt or Pd is deposited onto the silicide layer 14. This deposit forms the barrier layer 16 as illustrated in FIG. 1. The barrier layer 16 is deposited in a vacuum and its thickness is approximately 500 Å. If this step is omitted as is the current practice in IGFET devices penetration of the conductor metal may occur during subsequent processing.

Finally, the aluminum conductor metallurgy 12 as illustrated in FIG. 1, is evaporated onto the barrier layer 16. Before the final deposition of the conductor. It is possible to use intermediate masking steps (not shown) to assure the proper patterning, of alternatively, the patterning may be effected after the aluminum is deposited.

The flow diagram of FIG. 3 illustrates the processing steps and metallization techniques which can be employed to produce the prior art device illustrated in FIG. 1. The process requires depositing two intermediate metallic layers between the contact and the substrate. The necessity for deposition of two metallic layers has been eliminated by the present invention. Furthermore, the reaction of the noble metal with the substrate 10 to form a noble metal silicide layer 14, such as $Pd_2Si$ or PtSi, requires a consumption of Si, the volume of which is about equal to the volume of metal deposited in step 32. This reaction results in significant penetration of the silicide layer 14 into the silicon substrate 10 which creates a problem in designing a practical process for contacting very shallow junctions such as exist in $\mu m$ or smaller FET's. This consumption problem can be eliminated by the present invention since the formation of the Al-noble metal silicide consumes only about 1/7 the volume of Si required by the noble metal silicide in the prior art device.

Figure 4:
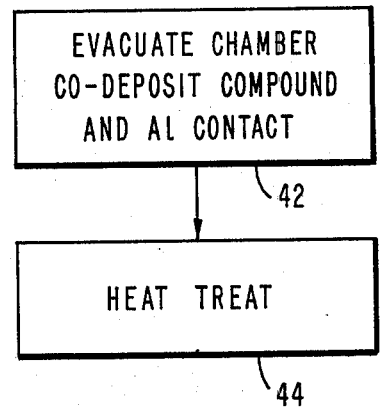
FIG. 4 is a flow diagram illustrating the fabrication steps for one embodiment of the method for producing the contact of the present invention.

In addition, the method of the present invention reduces the number of process steps required to form a reliable contact. FIG. 4 is a flow diagram for one method of practicing the present invention. The substrate is placed in an evacuated chamber after suitable preparation and the chamber is evacuated to about $10^{-7}$ torr and preferably below that pressure. Thereafter, an alloy of aluminum and at least one noble metal from the group of platinum and palladium is deposited onto the substrate. The aluminum content of the codeposited layer is between about 40 to 60 atomic %. When the aluminum content is maintained within these compositional limits and only one noble metal is employed it has been found that upon appropriate heat treatment as subsequently described, a silicide of the form of $Al_3Pd_4Si$ or $Al_3Pt_4Si$ will form. It is preferable that the co-deposited alloy be about 50 percent aluminum to assure a more complete formation of such a ternary compound. The co-deposition may be accomplished by a variety of techniques such as:

(a) simultaneous evaporation of aluminum and the noble metal from individual sources using two electron beam power supplies,
(b) sputtering from a homogeneous alloy target of the appropriate composition, or
(c) simultaneous evaporation using resistive heating of two sources.

Typically, these co-deposited layers should be between about 200 Å and 1500 Å thick.

Subsequent to the deposition of the co-deposited aluminum noble metal alloy the aluminum metallurgy 12 shown in FIG. 2 may be deposited. Typically, the thickness of the aluminum contact is between about 1/4 micron and 1 micron.

The co-deposition of the aluminum alloy and the deposition of the aluminum metallurgy can be accomplished in a single step as is illustrated in step 42 of FIG. 4. In this case, during the early part of the deposition, a controlled quantity of noble metal is co-deposited with aluminum and thereafter only the aluminum is deposited. If for example an AlPd layer is desired, it can be obtained by employing an evaporation rate for aluminum of about 6 Å/sec and for Pd of about 5 Å/sec. After correcting for the density difference, this combination of the evaporation rates gives about equal atomic compositions for Al and Pd. The evaporation can be carried out at room temperature under a vacuum of about $10^{-6}$ to $10^{-7}$ torr.

After the deposition step has been completed the composite structure is heated. During the heat treatment step 44, the substrate and deposited layer are heated to between about 400° C. to approximately 600° C. for a time sufficient to form a region which is further alloyed with silicon. It is preferred to heat for a time sufficient, to completely react the co-deposited aluminum noble metal layer with silicon. For a 1000 Å alloy film these times will be typically ½ hour. $Al_3Pd_4Si$ is formed when the co-deposited noble metal is Pd.

A co-deposited Al and Pt layer forms a silicide compound which has an electron diffraction pattern observed using a transmission electron microscope to be virtually identical to that of $Al_3Pd_4Si$. The compound of $Al_3Pt_4Si$ has not been reported in the published literature, but based on the diffraction pattern the compound has been tentatively identified as $Al_3Pt_4Si$.

A systematic series of tests were conducted to establish the parameters which controlled the formation of ternary silicides. The test results are summarized in Table I and illustrate the structure which is observed from co-evaporation of 800 Å to 1500 Å of a noble metal aluminum alloy onto a SI substrate and subsequent heat treatment. From a thermodynamic point of view one would expect that the ternary compounds would co-exist with binary compounds or a binary compound and the pure element depending upon the Al-noble metal ratio deposited and the time-temperature treatment applied in the essentially nonequilibrium process used.

These binary phases and any aluminum phase which are formed during reaction is located on top of the reacted junction of $Al_3Pd_4Si/Si$ or $Al_3Pt_4Si/Si$. Defraction studies indicate both the AlPd and $Al_2Pt$ have a cubic crystal structure.

TABLE I

| Deposition Rates A/Sec. | | Deposited Film | PHASES PRESENT AFTER HOLDING AT ANNEALING TEMPERATURE FOR ½ HOUR | | | |
|---|---|---|---|---|---|---|
| Al | Pt or Pd | | 300° C. | 400° C. | 500° C. | 600° C. |
| 7 | 4 | $Al_{0.6}Pd_{0.4}$ (1800Å) | $Al_3Pd_4Si$ + AlPd (~20%) + Al | $Al_3Pd_4Si$ + Al | $Al_3Pd_4Si$ + Al | $Al_3Pd_4Si$ + Al |
| 6 | 5 | $Al_{0.5}Pd_{0.5}$ (1800Å) | AlPd + $Al_3Pd_4Si$ (<5%) + small amount $Pd_2Si$ | $Al_3PdSi$ + AlPd (top layer) | $Al_3Pd_4Si$ + AlPd | $Al_3Pd_4Si$ + AlPd |
| 5 | 2 | $Al_{0.75}Pd_{0.25}$ (1800Å) | AlPd + Al | AlPd + Al | AlPd + Al | AlPd + Al |
| 5 | 5 | $Al_{0.5}Pt_{0.5}$ (500Å) | $Al_2Pd$ + Pt | $Al_3Pt_4Si$ (30%) + $Al_2Pt$ + Pt | $Al_3Pt_4Si$ + Al | $Al_3Pt_4Si$ + Al |

As can be seen from examination of this table, in order to obtain the desired ternary alloy compounds it is necessary to limit the concentration of the aluminum in the co-evaporated deposits. In general, the ratio aluminum to noble metal should be kept in the atomic ratio of between 3 to 2 and 2 to 3. It should be noted, that when the ratio of Al to Pd becomes 3 to 1 the desired ternary alloy does not occur.

Furthermore, to establish substantial transformation to the ternary alloy it can be seen from examination of Table I that it is preferred to anneal the co-deposited metal at a temperature between about 400° C. and 600° C.

It should be appreciated that the heat treatment which promotes reaction of the silicon with the co-deposited metal will reduce contact resistance and overcome the problem resulting from techniques such as those suggested by Crowder et al where no reaction occurs between the deposited layer and the Si substrate. Furthermore, although the present invention promotes reaction between the silicon substrate the consumption of Si is minimized. When the aluminum noble metal alloy is within the compositional ranges specified by the present invention the appropriate temperature for heat treatment will be between about 400° C. to about 600° C. The alloy formed requires consumption of relatively little silicon since it is either $Al_3Pd_4Si$ or $Al_3Pt_4Si$. The concentration of silicon in these alloys is much lower than that for the comparable binary silicides, PtSi or $Pd_2Si$.

Figure 5:
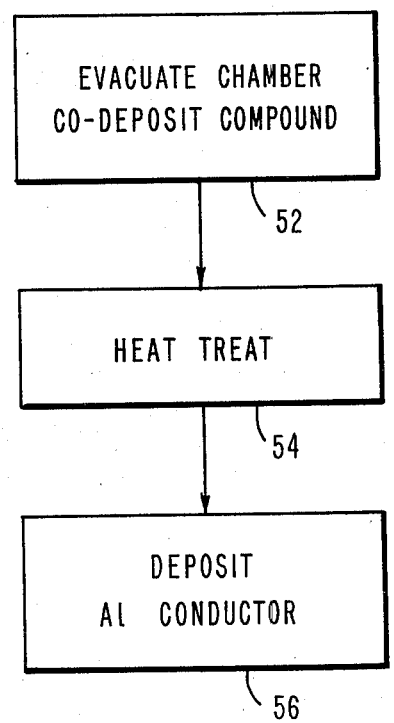
FIG. 5 is a flow diagram illustrating the fabrication steps for a second embodiment of the method for producing the contact of the present invention.

When masking steps are required to produce the metallization for the contacts, additional steps will be required as is illustrated by the flow diagram in FIG. 5. In this case, the first step is the co-deposition of an aluminum noble metal alloy as is illustrated in step 52. Thereafter, the co-deposited alloy will be heat treated as discussed above, step 54. After the heat treatment, masking steps may be implemented to effect the final patterning during the deposition step 56 to form the aluminum contact.

Figure 6:
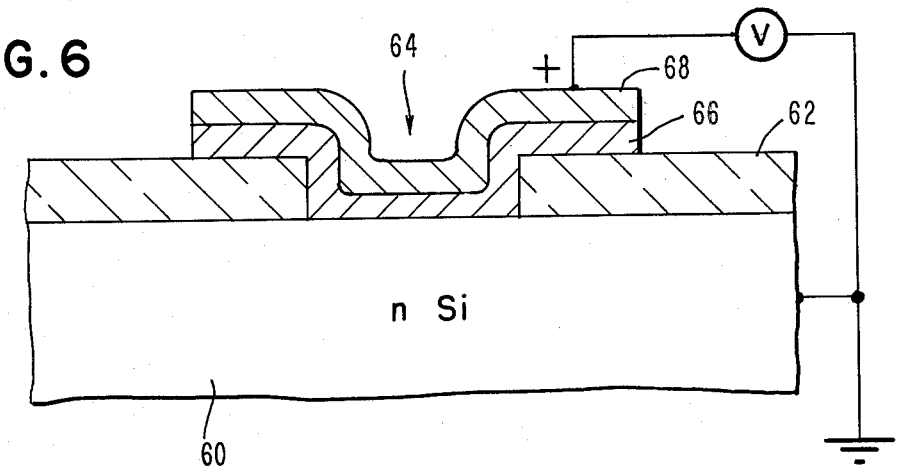
FIG. 6 is an illustration of the test sample configuration for I-V test measurements.

In order to aid in accessing the characteristics of the contacts of the present invention, a series of samples were prepared for I-V measurements. The geometry of the I-V test device is illustrated in FIG. 6. Silicon doped with n type impurities to yield a resistance of about 1 to 10 Ω-cm is employed as a substrate 60. A $SiO_2$ layer 62 having a round aperture 64, is deposited onto the substrate 60. The diameter of the aperture 64 is either 1, 4, 9 or 16 mils. A layer of co-deposited aluminum noble metal alloy 66 approximately 1500 Å thick is deposited into the aperture 64 and contacts the substrate 60. The alloy upon heat treatment forms the desired ternary alloy. In contact with the co-deposited alloy 64 is an Al contact 18 about 1500 Å in thickness.

A variable voltage supply 70 is electrically connected to the contact 68 and the substrate 60.

An I-V analysis of the Schottky barrier junction forward bias characteristics can be made by varying the potential applied and recording the resulting current. A semilogarithmic plot of the current vs. the voltage yields a straight line. The slope of the line is proportional to the inverse of the ideality index and the zero current intercept of the line can be used to calculate the Schottky barrier height.

Further details of the test procedure for metal semiconductor rectifiers are found in the article by V. L. Rideout "A Review of the Theory, Technology and Application of Metal—Semiconductor Rectifiers", Thin Solid Films, Vol. 48, pp. 261-291 (1968).

The results of the tests are tabulated in Table II.

Good thermal stability was observed for the tested barrier junction under sequential annealing up to 500° C. judging from the relatively constant values of the barrier height and the ideality index. In addition, the small values of the standard deviations indicate good reproductibility of the test device characteristics.

TABLE II

RESULTS FROM I-V MEASUREMENTS ON SCHOTTKY BARRIER JUNCTIONS

| SAMPLE STRUCTURE | HEAT TREATMENT | NO. OF SAMPLES MEASURED | BARRIER HEIGHTS IN eV. | | IDEALITY INDEX n | |
|---|---|---|---|---|---|---|
| | | | Av. | Std. dev. | Av. | Std. dev. |
| Al/AlPd/Si | As-deposited | 10 | 0.80 | 0.01 | 1.06 | 0.02 |
| | 400° C. ½ hr. | 12 | 0.81 | 0.02 | 1.06 | 0.03 |
| | 450° C. ½ hr. | 12 | 0.77 | 0.02 | 1.07 | 0.01 |
| | 500° C. ½ hr. | 11 | 0.73 | 0.01 | 1.07 | 0.01 |
| Al/$Al_3Pd_2$/Si | As-deposited | 11 | 0.83 | 0.01 | 1.04 | 0.02 |
| | 400° C. ½ hr. | 9 | 0.83 | 0.01 | 1.04 | 0.02 |
| | 450° C. ½ hr. | 8 | 0.83 | 0.01 | 1.05 | 0.02 |
| | 500° C. ½ hr. | 7 | 0.83 | 0.01 | 1.03 | 0.01 |
| Al/AlPt/Si | As-deposited | 18 | 0.70 | 0.02 | 1.08 | 0.01 |
| | 400° C. ½ hr. | 9 | 0.72 | 0.01 | 1.07 | 0.05 |
| | 500° C. ½ hr. | 11 | 0.72 | 0.01 | 1.05 | 0.01 |

As can be seen from analyzing the results tabulated in Table II, the test samples provide for barriers which are not subject to thermal degradation. These structures are stable when the temperature of heat treatment is between about 450° C. and 550° C. and the Al to noble ratio falls within the ranges earlier set forth. Furthermore, the ideality index of the samples, which is an index of the merit of the Schottky barrier, approaches the value of unity. For an ideal Schottky barrier this value would be unity.

The fact that these materials are stable when so heat treated allows greater flexibility in the process steps which can be employed in fabricating devices employing the contact of the present invention.

Industrial Applicability

The present invention is well suited to the semiconductor industry for use in fabricating ohmic and/or Schottky barrier contacts. The fabrication technique herein described is generally useable for fabrication of semiconductor devices and is particularly useful for fabrication of shallow junction devices such as those employed in insulated gate field effect transistors (IGFET's).

While the novel features of the invention have been described in terms of preferred embodiments and for particular industrial applications, it will be understood that various omissions and substitutions in the form and details of the method and device illustrated or other applications may be made by those skilled in the art without departing from the spirit of the invention.

Having thus described our invention, what we claim as new, and desire to secure by Letters Patent is:

1. A contact for making an electrical connection between an aluminum conductor and a silicon substrate comprising:
   aluminum alloyed with at least one noble metal from the group Pd and Pt to form a resultant alloy wherein at least one region of said resultant alloy is further alloyed with silicon; and
   wherein the ratio of Al to said noble metals is in the atomic ratio of between about 3 to 2 and 2 to 3.

2. The contact of claim 1, wherein said further alloyed region has the ratio of Si to other elements of between about 1 to 6 and 1 to 10.

3. The contact of claim 2, wherein said noble metal is Pt and said further alloyed region forms the compound $Al_3Pt_4Si$.

4. The contact of claim 2, wherein said noble metal is Pd and one said further alloyed region forms the compound $Al_3Pd_4Si$.

5. The contact of claim 1, wherein said region alloyed with Si is throughout said contact.

* * * * *